(12) United States Patent
Matsuzaki et al.

(10) Patent No.: US 10,490,450 B2
(45) Date of Patent: Nov. 26, 2019

(54) ELECTROSTATIC CHUCK TABLE

(71) Applicant: DISCO CORPORATION, Tokyo (JP)

(72) Inventors: Sakae Matsuzaki, Tokyo (JP); Noriko Ito, Tokyo (JP); Ken Togashi, Tokyo (JP); Kenji Furuta, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/645,462

(22) Filed: Jul. 10, 2017

(65) Prior Publication Data

US 2018/0019168 A1    Jan. 18, 2018

(30) Foreign Application Priority Data

Jul. 12, 2016  (JP) .................................. 2016-137984

(51) Int. Cl.
| | |
|---|---|
| H01L 21/67 | (2006.01) |
| B23K 26/53 | (2014.01) |
| H01L 21/78 | (2006.01) |
| B23K 26/359 | (2014.01) |
| H01L 21/268 | (2006.01) |
| H01L 21/683 | (2006.01) |

(52) U.S. Cl.
CPC ............ *H01L 21/78* (2013.01); *B23K 26/359* (2015.10); *B23K 26/53* (2015.10); *H01L 21/268* (2013.01); *H01L 21/67092* (2013.01); *H01L 21/67115* (2013.01); *H01L 21/6831* (2013.01); *H01L 21/6833* (2013.01)

(58) Field of Classification Search
CPC ............ H01L 21/6831; H01L 21/6833; H01L 21/67115; H01L 21/268; H01L 21/78; B23K 26/359; B23K 26/0853; B23K 26/0876; B23K 26/02; B23K 26/042; B23K 26/53

See application file for complete search history.

(56) References Cited

U.S. PATENT DOCUMENTS

| | | | |
|---|---|---|---|
| 5,691,876 A | * | 11/1997 | Chen .................. H01L 21/6831 361/234 |
| 5,708,557 A | * | 1/1998 | Feigenbaum ....... H01L 21/6831 279/128 |

(Continued)

FOREIGN PATENT DOCUMENTS

JP         2002-192370         7/2002

*Primary Examiner* — Michael M Trinh
(74) *Attorney, Agent, or Firm* — Greer Burns & Crain, Ltd.

(57) ABSTRACT

An electrostatic chuck table for holding a workpiece includes: a plate-shaped base transmittable with respect to a laser beam having a predetermined wavelength allowing the laser beam to be transmitted through the workpiece, the plate-shaped base having a first surface and a second surface opposite the first surface; an electrostatic attraction electrode assembly transmittable with respect to the laser beam having the predetermined wavelength, the electrostatic attraction electrode assembly being formed on the first surface of the base; and a resin layer transmittable with respect to the laser beam having the predetermined wavelength, the resin layer covering the electrode assembly and providing a holding surface for holding the workpiece thereon. The electrostatic chuck table is used in forming a modified layer within the workpiece held on the holding surface with the laser beam that is applied to the workpiece from the side of the second surface of the base.

6 Claims, 6 Drawing Sheets

(56) References Cited

U.S. PATENT DOCUMENTS

| | | | | |
|---|---|---|---|---|
| 6,071,630 A | * | 6/2000 | Tomaru | B23Q 3/154 |
| | | | | 279/128 |
| 2005/0109742 A1 | * | 5/2005 | Nagai | B23K 26/02 |
| | | | | 219/121.73 |
| 2008/0029715 A1 | * | 2/2008 | Morikazu | B23K 26/04 |
| | | | | 250/491.1 |
| 2017/0278761 A1 | * | 9/2017 | deVilliers | C23C 16/50 |

* cited by examiner

ELECTROSTATIC CHUCK TABLE

BACKGROUND OF THE INVENTION

Field of the Invention

The present invention relates to an electrostatic chuck table, and a laser processing apparatus that is provided with the electrostatic chuck table.

Description of the Related Art

There is known a processing method in which a laser processing apparatus is used to divide a wafer with semiconductors or optical devices such as light-emitting diodes (LEDs), etc. formed thereon, and the wafer starts to be divided by a laser beam from a modified layer formed therein that acts as fracture starting points (see Japanese patent No. 3408805).

The processing method disclosed in Japanese patent No. 3408805 is highly useful for wafers with narrower streets because it can achieve highly reduced kerf widths, compared with a conventional dicing process which cuts a wafer with a cutting blade while supplying cutting water to the wafer.

The processing method disclosed in Japanese patent No. 3408805 is also highly effective because any mechanical shocks applied to a workpiece are very small, allowing a wafer with microstructures known as micro electro mechanical systems (MEMSs), for example, formed thereon to be divided without the MEMS being destroyed.

SUMMARY OF THE INVENTION

The laser beam is of such a wavelength that can be transmitted through the wafer, but cannot be transmitted through metal layers of circuits, etc. of devices formed on the wafer. Therefore, in order that the reverse side of the wafer which is free of the metal layers can be irradiated with the laser beam, it is necessary to hold the device-side surface of the wafer on the holding surface of a chuck table, to specially design the wafer with no test element group (TEG) pattern (test element pattern) on projected dicing lines, and to provide the step of removing a TEG pattern in advance.

It is therefore an object of the present invention to provide an electrostatic chuck table which allows a workpiece to be processed with a laser beam from the holding surface side of the chuck table while the face side of the workpiece with metal layers and devices formed thereon is being exposed and the reverse side of the workpiece is being held on the holding surface of the electrostatic chuck table.

In accordance with an aspect of the present invention, there is provided an electrostatic chuck table for holding a workpiece, comprising: a plate-shaped base transmittable with respect to a laser beam having a predetermined wavelength allowing the laser beam to be transmitted through the workpiece, said plate-shaped base having a first surface and a second surface opposite said first surface; an electrostatic attraction electrode assembly transmittable with respect to said laser beam having the predetermined wavelength, the electrostatic attraction electrode assembly being formed on the first surface of said base; and a resin layer transmittable with respect to said laser beam having the predetermined wavelength, the resin layer covering said electrode assembly and providing a holding surface for holding said workpiece thereon; wherein said chuck table is adapted for use when said laser beam is applied to said workpiece held on said holding surface from a side of the second surface of said base to form a modified layer within said workpiece.

Preferably, the predetermined wavelength is in a range of 500 to 1400 nm.

Preferably, the workpiece includes a wafer with a plurality of MEMS devices formed on a face side thereof, the wafer having a reverse side held on the holding surface of the electrostatic chuck table.

The electrostatic chuck table according to the present invention is advantageous in that it makes it possible to process the workpiece with the laser beam while the face side of the workpiece on which metal layers and devices are formed is being exposed and the reverse side thereof is being held on the holding surface.

In accordance with another aspect of the present invention, there is provided a laser processing apparatus including an electrostatic chuck table for holding a workpiece, and a laser beam irradiation unit for forming a modified layer within the workpiece held by the electrostatic chuck table with a laser beam having a wavelength allowing the laser beam to be transmitted through the workpiece. The electrostatic chuck table includes: a plate-shaped base transmittable with respect to the laser beam having a predetermined wavelength allowing the laser beam to be transmitted through the workpiece, the plate-shaped base having a first surface and a second surface opposite the first surface; an electrostatic attraction electrode assembly transmittable with respect to the laser beam having the predetermined wavelength, the electrostatic attraction electrode assembly being formed on the first surface of the base; and a resin layer transmittable with respect to the laser beam having the predetermined wavelength, the resin layer covering the electrode assembly and providing a holding surface for holding the workpiece thereon. The workpiece has a reverse side held on the holding surface of the electrostatic chuck table, and the laser beam is applied from the laser beam irradiation unit to the workpiece from a side of the second surface of the base to form a modified layer within the workpiece.

In accordance with a further aspect of the present invention, there is provided a method of processing a workpiece having a reverse side held on an electrostatic chuck table, the electrostatic chuck table having a first surface and a second surface opposite the first surface, and including: a plate-shaped base transmittable with respect to a laser beam having a predetermined wavelength allowing the laser beam to be transmitted through the workpiece; an electrostatic attraction electrode assembly transmittable with respect to the laser beam having the predetermined wavelength, the electrostatic attraction electrode assembly being formed on the first surface of the base; and a resin layer transmittable with respect to the laser beam having the predetermined wavelength, the resin layer covering the electrode assembly and providing a holding surface for holding the workpiece thereon, the method including the steps of: holding the reverse side of the workpiece on the holding surface of the electrostatic chuck table; and forming a modified layer within the workpiece held on the holding surface with the laser beam that has transmitted through the electrostatic chuck table by applying the laser beam to the workpiece held on the holding surface from a side of the second surface of the base.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described in detail below with reference to the drawings. The present invention should not be construed as being limited to the details described in the preferred embodiments. Components described below in the preferred embodiments shall cover those which are obvious to persons skilled in the art and those which are essentially identical to them. The details described below may be combined with each other in various ways. A variety of omissions, replacements, and modifications may be made in the illustrated embodiments without departing from the scope of the invention.

First Embodiment

Figure 1:
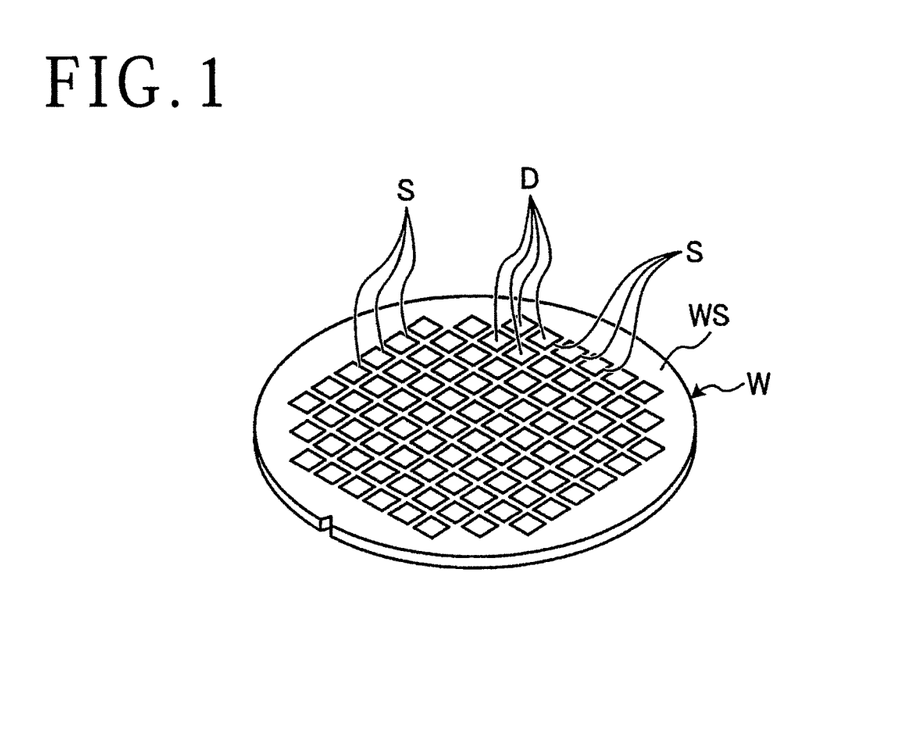
FIG. 1 is a perspective view of a workpiece to be processed by a processing method according to a first embodiment of the present invention.

An electrostatic chuck table 1, a laser processing apparatus 10, and a method of processing a workpiece W (hereinafter also referred to as "processing method") according to a first embodiment of the present invention will be described below with reference to the drawings. FIG. 1 shows in perspective the workpiece W to be processed by the processing method according to the first embodiment, and FIG. 2 shows in perspective the workpiece W shown in FIG. 1 which is supported on an annular frame F.

The processing method according to the first embodiment is a method of processing the workpiece W shown in FIG. 1. According to the first embodiment, the workpiece W shown in FIG. 1 includes a disk-shaped semiconductor wafer or optical device wafer made of a base material such as silicon, sapphire, gallium, or the like. As shown in FIG. 1, the workpiece W is a plate-shaped object having devices D formed in respective areas of a face side WS thereof which are demarcated by a plurality of crossing projected dicing lines S. The devices D may include integrated circuits (ICs), large scale integrations (LSIs), and micro electro mechanical systems (MEMSs) in the respective areas.

Figure 2:
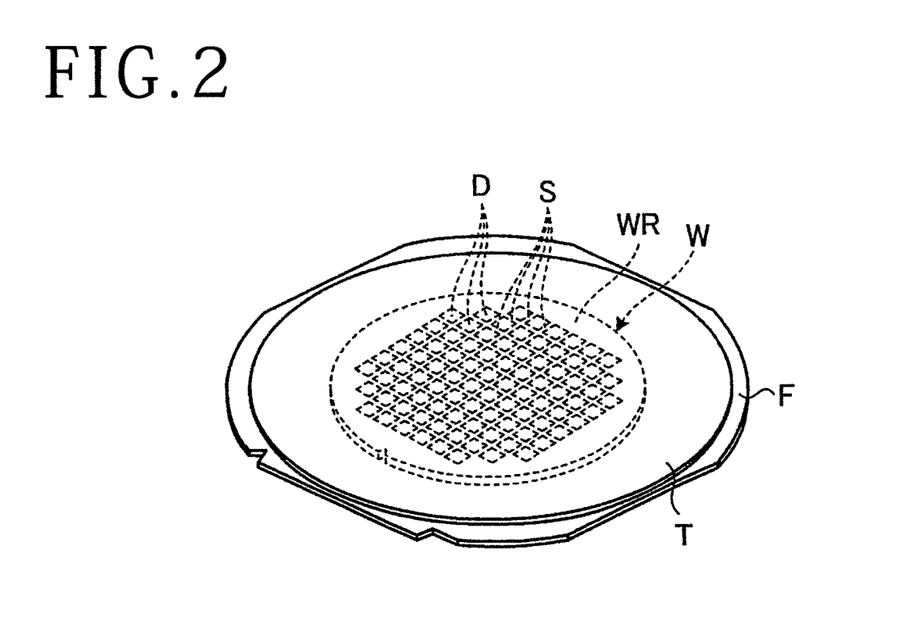
FIG. 2 is a perspective view of the workpiece shown in FIG. 1 which is supported on an annular frame.

As shown in FIG. 2, the workpiece W is supported on an annular frame F over an opening thereof by an adhesive tape T, also referred to as a dicing tape. The adhesive tape T is applied to a reverse side WR of the workpiece W which is opposite the face side WS with the devices D formed thereon, and has an outer marginal edge portion applied to the annular frame F. In the first embodiment, the workpiece W which is supported on the annular frame F over the opening thereof by the adhesive tape T is divided into the individual devices D by the processing method according to the first embodiment. In the first embodiment, the MEMS devices as devices D are formed on the face side WS of the workpiece W. The devices D are not limited to the MEMS devices. In the first embodiment, if the devices D are ICs or LSIs, then the workpiece W should preferably have bumps or chips on its face side WS and hence surface irregularities.

Figure 3:
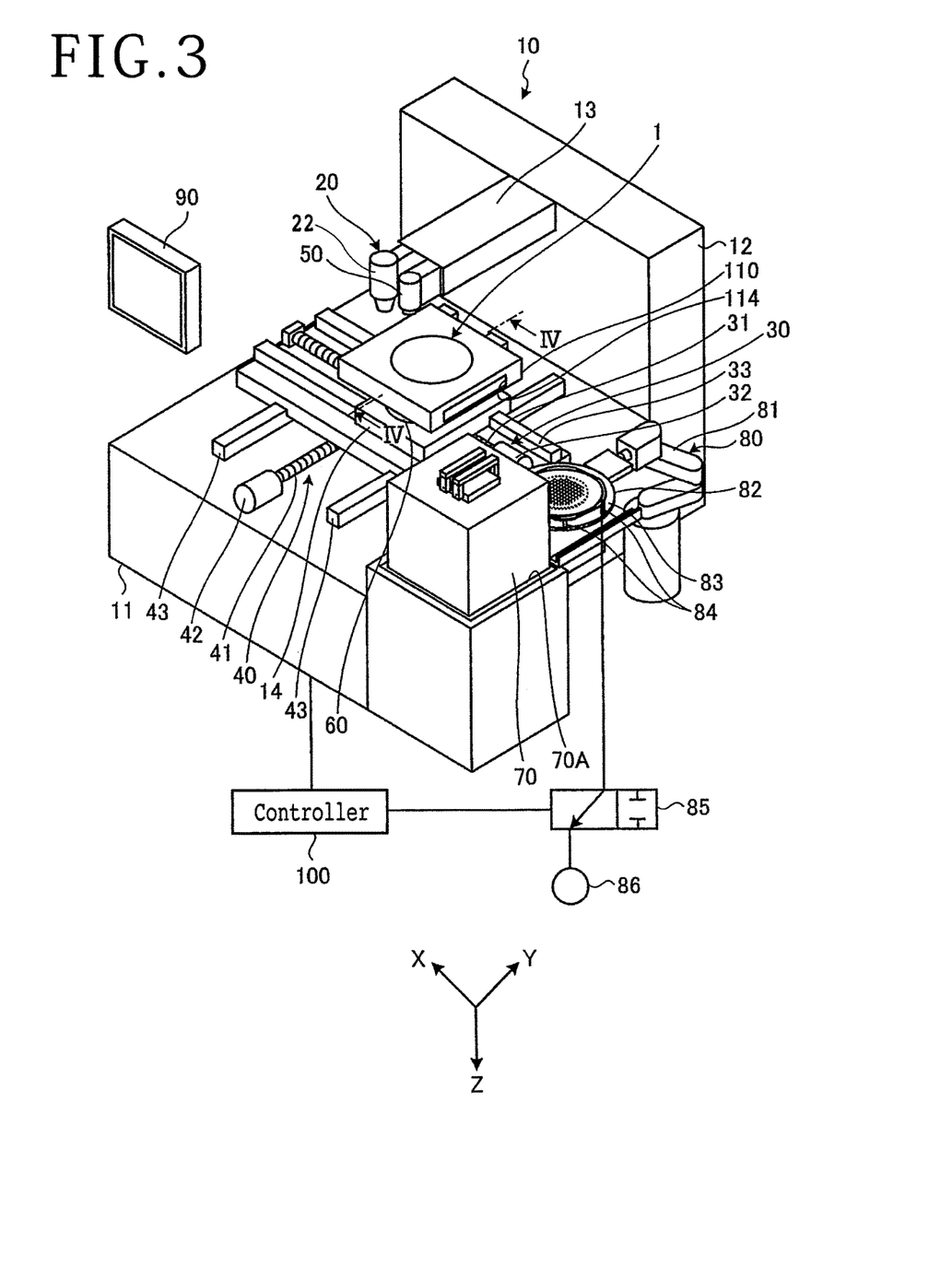
FIG. 3 is a perspective view showing structural details of a laser processing apparatus according to the first embodiment.
Figure 4:
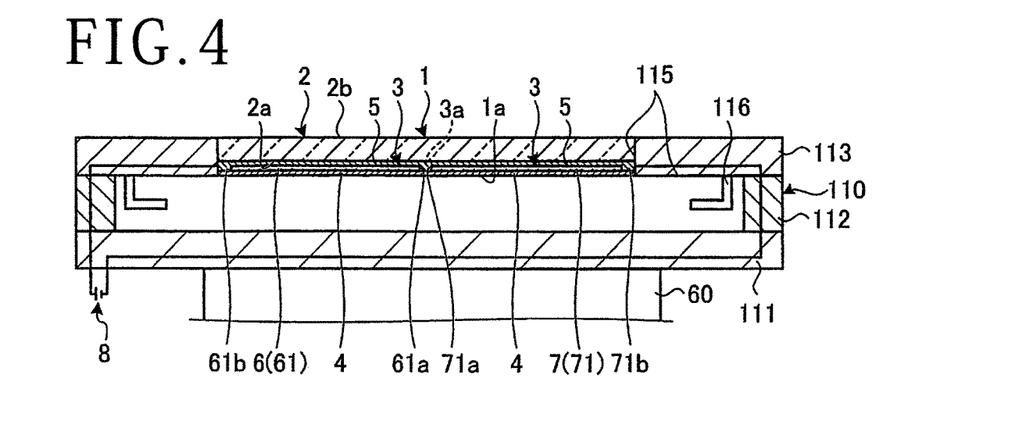
FIG. 4 is a cross-sectional view taken along line IV-IV of FIG. 3.
Figure 5:
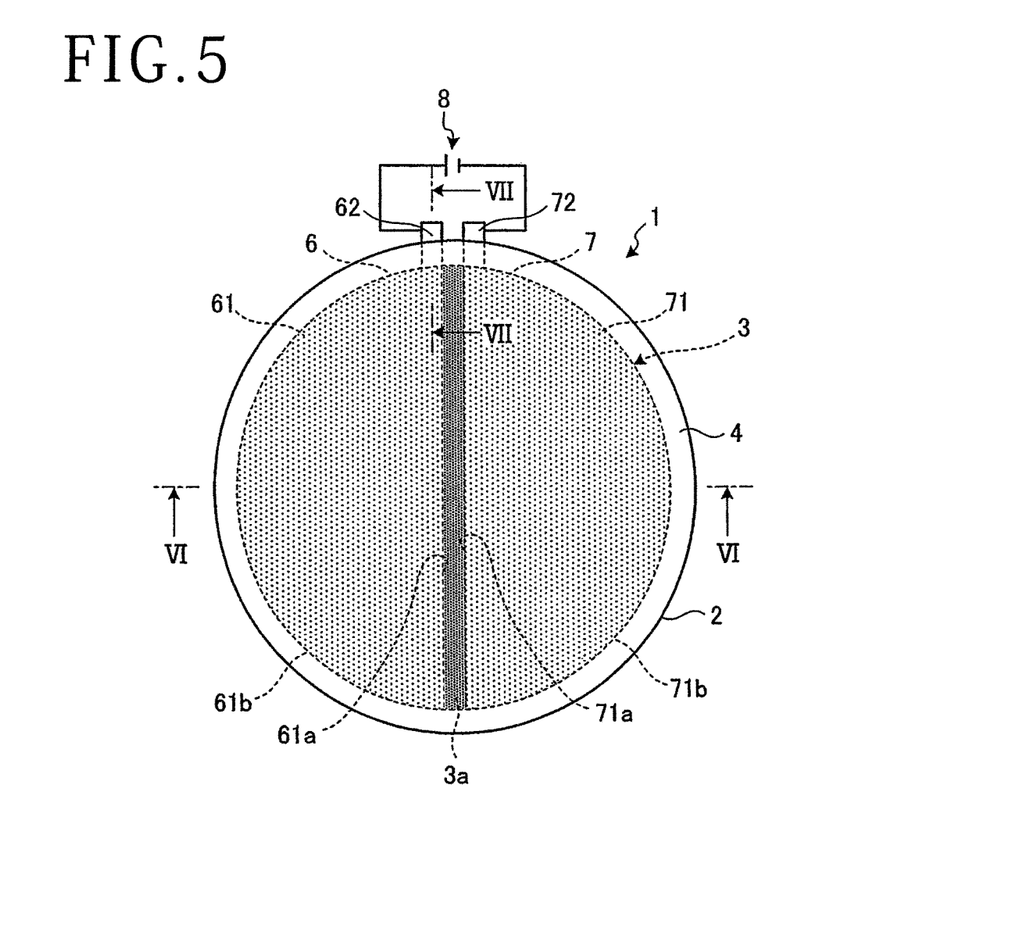
FIG. 5 is a plan view showing structural details of an electrostatic chuck table according to the first embodiment.
Figure 6:
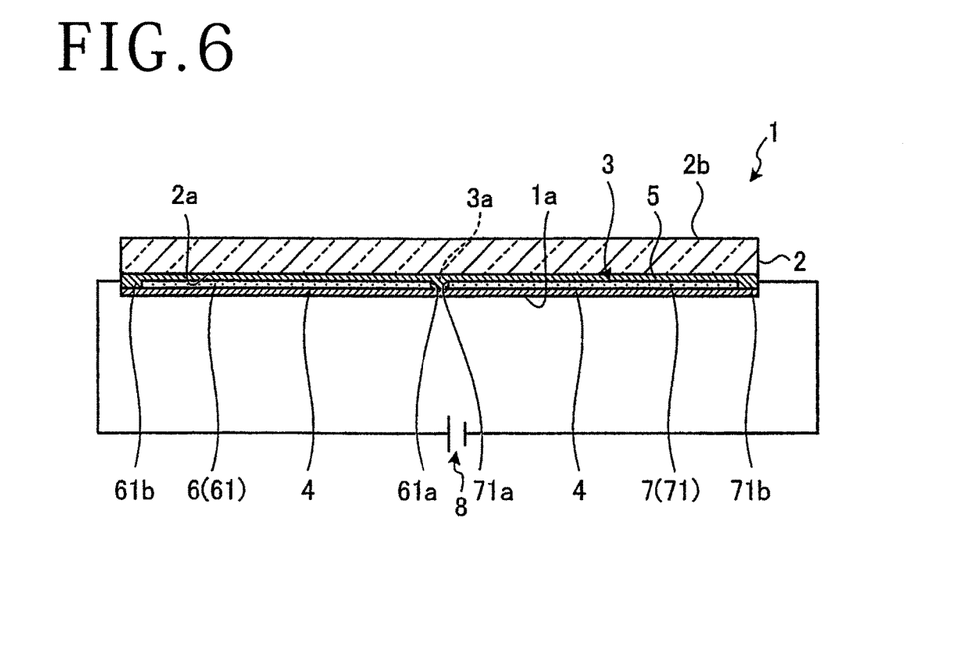
FIG. 6 is a cross-sectional view taken along line VI-VI of FIG. 5.
Figure 7:
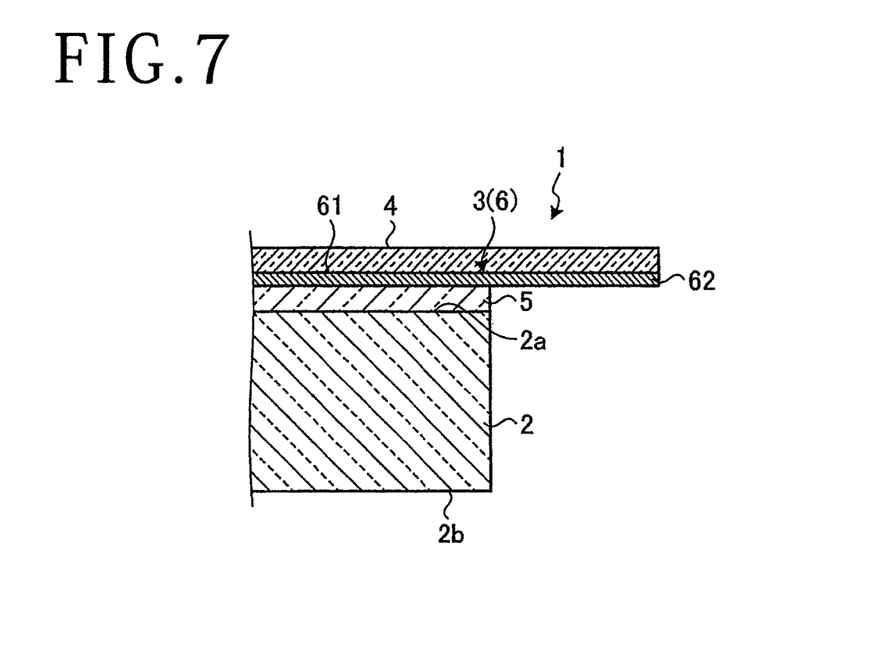
FIG. 7 is a cross-sectional view taken along line VII-VII of FIG. 5.

The laser processing apparatus 10 according to the first embodiment will be described below with reference to the drawings. FIG. 3 shows in perspective structural details of the laser processing apparatus 10 according to the first embodiment. FIG. 4 is a cross-sectional view taken along line IV-IV of FIG. 3. FIG. 5 shows in plan structural details of an electrostatic chuck table according to the first embodiment. FIG. 6 is a cross-sectional view taken along line VI-VI of FIG. 5. FIG. 7 is a cross-sectional view taken along line VII-VII of FIG. 5.

The laser processing apparatus 10 applies a laser beam L (see FIG. 9) having a wavelength allowing the laser beam to be transmitted through the workpiece W, from the reverse side WR of the workpiece W, while sweeping along the projected dicing lines S, thereby forming a modified layer K (see FIG. 9) within the workpiece W, which layer acts as fracture starting points. The modified layer K refers to a region whose density, refractive index, mechanical strength, and other physical properties are different from those of a surrounding region of the workpiece W. The modified layer K may be, for example, a melted region, a cracked region, a dielectric-breakdown region, a varied-refractive-index region, or a region where some or all of these regions occur together.

As shown in FIG. 3, the laser processing apparatus 10 includes a disk-shaped electrostatic chuck table 1 for holding the workpiece W on a holding surface 1a (see FIG. 4) thereof, a laser beam irradiation unit 20 as processing means, X-axis moving means 30 for moving the electrostatic chuck table 1 and the laser beam irradiation unit 20 relatively to each other along X-axis directions, Y-axis moving means 40 for moving the electrostatic chuck table 1 and the laser beam irradiation unit 20 relatively to each other along Y-axis directions, imaging means 50, and a controller 100.

The laser beam irradiation unit 20 is a unit for irradiating the workpiece W held on the holding surface 1a of the electrostatic chuck table 1 with the laser beam L having a predetermined wavelength allowing the laser beam to be transmitted through the workpiece W from the reverse side WR thereof. The laser beam irradiation unit 20 serves to form a modified layer K within the workpiece W with the laser beam L. The wavelength of the laser beam L that is emitted from the laser beam irradiation unit 20 is in the range from 500 to 1400 nm. The laser beam irradiation unit 20 is mounted on the distal end of a support arm 13 connected at its proximal end to an upstanding wall 12 that is attached to an apparatus body 11 of the laser processing apparatus 10. The laser beam irradiation unit 20 includes an oscillator, not shown, for oscillating the laser beam L and a beam condenser 22 for converging the laser beam L from the oscillator. The oscillator is capable of adjusting the frequency of the laser beam L depending on the kind of the workpiece W and the form into which the workpiece W is to be processed. The beam condenser 22 includes a total-reflection mirror for changing the direction of travel of the laser beam L from the oscillator and a condensing lens for converging the laser beam L.

The X-axis moving means 30 is process-feeding means for process-feeding the electrostatic chuck table 1 along the X-axis direction that lies parallel to both the widthwise direction of the apparatus body 11 and horizontal direction, by moving the electrostatic chuck table 1 along the X-axis direction. The Y-axis moving means 40 is index-feeding means for index-feeding the electrostatic chuck table 1 along the Y-axis direction that lies parallel to horizontal direction and perpendicularly to the X-axis direction, by moving the electrostatic chuck table 1 along the Y-axis direction. The X-axis moving means 30 and the Y-axis moving means 40 include known ball screws 31 and 41, respectively, rotatable about their own axes and pairs of known guide rails 33 and 43 on which the electrostatic chuck table 1 is supported for movement along the X-axis directions and the Y-axis directions. The laser processing apparatus 10 also includes a rotary drive source 60 for rotating the electrostatic chuck table 1 about its own central axis parallel to Z-axis direction that lies perpendicularly to both the X-axis direction and the Y-axis direction. The rotary drive source 60 is disposed on a movable table 14 movable along the X-axis direction by the X-axis moving means 30.

The imaging means 50, which serves to image the workpiece W held on the electrostatic chuck table 1, is disposed in juxtaposed relation to the laser beam irradiation unit 20 along the X-axis direction. According to the first embodiment, the imaging means 50 is mounted on the distal end of the support arm 13. The imaging means 50 includes a charge coupled device (CCD) camera for capturing images of the workpiece W held on the electrostatic chuck table 1.

The laser processing apparatus 10 further includes a cassette elevator 70A for placing thereon a cassette 70 that stores workpieces W to be processed, a feed unit 80 for taking a workpiece W into and out of the cassette 70, and a touch panel 90 for displaying various items of information and also entering information representing various processing details.

The cassette 70 stores therein a plurality of workpieces W each applied to an annular frame F by an adhesive tape T. The cassette elevator 70A is vertically movable along the Z-axis direction.

The feed unit 80 is a unit for removing a workpiece W to be processed from the cassette 70 and placing the removed workpiece W on the electronic chuck table 1, and also for carrying a processed workpiece W from the electronic chuck table 1 into the cassette 70. The feed unit 80 has a movable arm 81 including a plurality of joints and arm members joined by the joints and a holder 82 mounted on the distal end of the movable arm 81 for holding a workpiece W.

The holder 82 includes a holder body 83 in the form of a C-shaped flat plate and a plurality of suction pads 84 disposed on the holder body 83 for attracting under suction the annular frame F that surrounds a workpiece W. The suction pads 84 are provided on an upper surface of the holder body 83 and connected to a vacuum suction source 86 through an on-off valve 85. The feed unit 80 attracts the annular frame F with the suction pads 84, which are positioned downwardly, and holds the workpiece W on a lower surface of the holder 82. Before a modified layer K is formed in the workpiece W disposed in the cassette 70, the workpiece W is exposed through the opening formed in the holder 82 and held thereby without being kept in contact with the holder 82. For introducing the workpiece W into the electrostatic chuck table 1, the holder 82 which is holding the workpiece W is turned upside down to face the adhesive tape T applied to the workpiece W upwardly, and presses the adhesive tape T side against the holding surface 1a of the electrostatic chuck table 1, thereby enabling the holding surface 1a to hold the workpiece W. For removing the workpiece W from the electrostatic chuck table 1 after a modified layer K has been formed in the workpiece W, the feed unit 80 holds the workpiece W on the holder 82, turns the holder 82 upside down, and carries the workpiece W into the cassette 70.

The touch panel 90 includes a liquid crystal display unit for displaying processing operation states and images, and a touch screen superposed on the liquid crystal display unit. The touch screen detects a finger, a pen, or a stylus pen that has contacted the touch screen or that has been brought near the touch screen. The touch screen also detects the position on the liquid crystal display unit, of the finger, the pen, or the stylus pen that has contacted the touch screen or that has been brought near the touch screen. The touch screen is a touch screen whose detection system is based on electrostatic capacitance, resistive film, surface acoustic waves, ultrasonic waves, infrared radiation, electromagnetic induction, or load detection.

The controller 100 controls components of the laser processing apparatus 10 to cause the laser processing apparatus 10 to carry out the operation for forming the modified layer K. Note that the controller 100 includes a computer system. The controller 100 includes an arithmetic processing unit having a microprocessor such as a central processing unit (CPU), a storage having a memory such as a read only memory (ROM) or a random access memory (RAM), and an input/output interface device.

The arithmetic processing unit of the controller 100 carries out arithmetic processing operations according to a computer program stored in the storage and outputs control signals for controlling the laser processing apparatus 10 through the input/output interface device to the components, referred to above, of the laser processing apparatus 10. The controller 100 is connected to the touch panel 90 that displays processing operation states and images, and the on-off valve 85.

As shown in FIG. 4, the electrostatic chuck table 1 is supported on the rotary drive source 60 through a workpiece housing case 110. The workpiece housing case 110 is in the form of a flat box mounted on the rotary drive source 60. The workpiece housing case 110 includes a bottom wall member 111 attached to the rotary drive source 60, a tubular member 112 attached to the outer edges of the bottom wall member 111, and a ceiling member 113 attached to the upper end of the tubular member 112. As shown in FIG. 3, the tubular member 112 has an inlet/outlet slot 114 through which the workpiece W held on the feed unit 80 can be taken into and out of the tubular member 112. The electrostatic chuck table 1 is mounted centrally on the ceiling member 113. According to the first embodiment, the electrostatic chuck table 1 has its outer edge attached to the inner circumferential surface of a central hole 115 defined in the ceiling member 113. Frame cramps 116 for clamping the annular frame F are provided in the workpiece housing case 110.

As shown in FIGS. 5, 6, and 7, the electrostatic chuck table 1 includes a plate-shaped base 2 transmittable with respect to the laser beam L, an electrostatic attraction electrode assembly 3 transmittable with respect to the laser beam L, and a polyethylene terephthalate (PET) film 4 as a resin layer transmittable with respect to the laser beam L. The base 2, which is made of glass, is in the form of a disk having a first surface 2a facing the inside of the workpiece housing case 110 and a second surface 2b opposite the first surface 2a. According to the first embodiment, the base 2 has a thickness of 1 mm. However, the thickness of the base 2 is not limited to 1 mm.

As shown in FIGS. 4, 6, and 7, the electrode assembly 3 is formed on the first surface 1a of the base 2 by an ultraviolet (UV) adhesive 5 transmittable with respect to the laser beam L. The UV adhesive 5 is curable upon exposure to ultraviolet rays, and is electrically insulative. According to the first embodiment, the UV adhesive 5 is a NORLAND optical adhesive manufactured by Norland Products, Inc., USA, but is not limited thereto.

The electrode assembly 3 is made of indium tin oxide (ITO). The refractive index of indium tin oxide of which the electrode assembly 3 is made is substantially equal to the refractive index of the UV adhesive 5. That these refractive indexes are substantially equal to each other means that they are different from each other to the extent that the modified layer K can be formed at a desired position by the laser beam L.

The electrode assembly 3 includes a positive electrode 6 and a negative electrode 7. The positive electrode 6 and the negative electrode 7 are electrically insulated from each other. The positive electrode 6 includes a positive attractive member 61 and a positive feeder terminal 62, and the negative electrode 7 includes a negative attractive member 71 and a negative feeder terminal 72. The positive attractive member 61 and the negative attractive member 71 are identical in shape to each other, i.e., semicircular in shape, and are of the same size. The positive attractive member 61 and the negative attractive member 71 have respective linear portions 61a and 71a extending parallel to each other and spaced from each other, as shown in FIG. 5, with an inter-electrode area 3a being present between the linear portions 61a and 71a. The positive attractive member 61 and the negative attractive member 71 have respective arcuate portions 61b and 71b disposed adjacent to and extending along the outer edge of the base 2. The arcuate portion 61b of the positive attractive member 61 of the positive electrode 6 and the arcuate portion 71b of the negative attractive member 71 of the negative electrode 7 are disposed in the vicinity of and extend along the outer edge of the base 2, and the electrode assembly 3 is formed on the first surface 2a, substantially in its entirety, of the base 2. The inter-electrode area 3a and the gap between the arcuate portions 61b and 71b of the positive attractive member 61 and the negative attractive member 71 and the outer edge of the base 2 are filled with the UV adhesive 5.

The positive feeder terminal 62 extends from the outer edge of the positive attractive member 61 outwardly in a direction away from the center of the holding surface 1a, and projects outwardly from the outer edge of the base 2. The negative feeder terminal 72 extends from the outer edge of the negative attractive member 71 outwardly in a direction away from the center of the holding surface 1a, and projects outwardly from the outer edge of the base 2. While the workpiece W is being held on the holding surface 1a, a positive voltage from a power supply 8 is applied at all times to the positive feeder terminal 62. While the workpiece W is being held on the holding surface 1a, a negative voltage from the power supply 8 is applied at all times to the negative feeder terminal 72. The PET film 4 covers the electrode assembly 3, and makes up the holding surface 1a that holds the workpiece W.

The electrostatic chuck table 1 attracts and holds the workpiece W placed on the holding surface 1a provided by the PET film 4 through the dicing tape T, under forces that are generated between the positive and negative attractive members 61 and 71 by the positive voltage applied from the positive feeder terminal 62 to the positive attractive member 61 and the negative voltage applied from the negative feeder terminal 72 to the negative attractive member 71.

Figure 8:
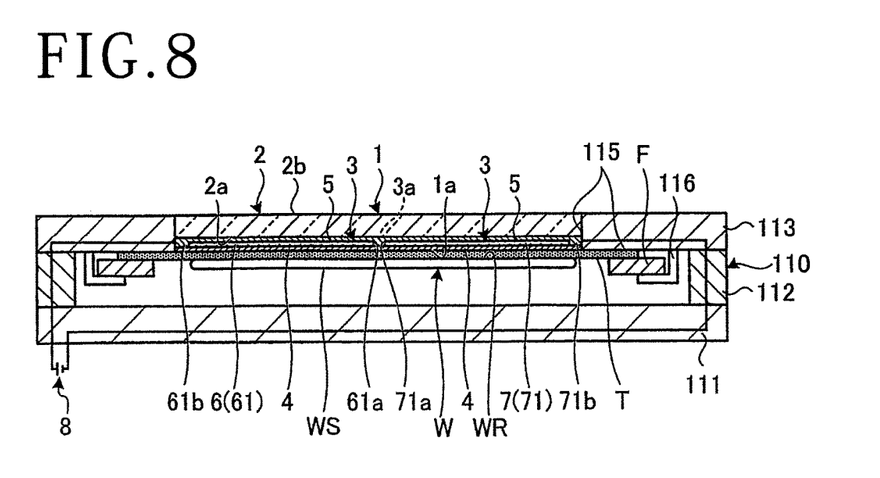
FIG. 8 is a cross-sectional view illustrative of a holding step of the processing method according to the first embodiment.
Figure 9:
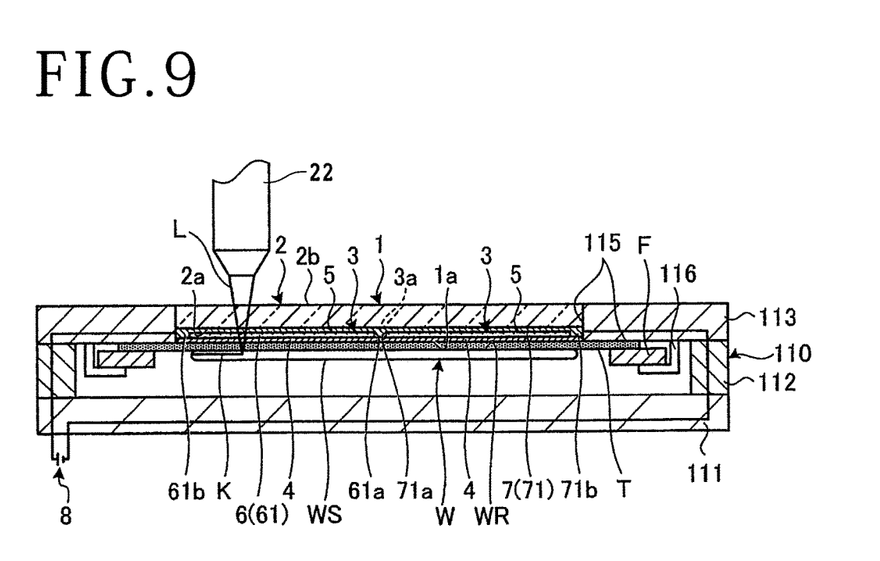
FIG. 9 is a cross-sectional view illustrative of a modified layer forming step of the processing method according to the first embodiment.

The processing method according to the first embodiment, carried out using the laser processing apparatus 10, will be described below with reference to the drawings. FIG. 8 illustrates in cross section a holding step of the processing method according to the first embodiment, and FIG. 9 illustrates in cross section a modified layer forming step of the processing method according to the first embodiment.

The processing method is started by the controller 100 of the laser processing apparatus 10 when the operator registers processing details information in the controller 100 of the laser processing apparatus 10 and instructs the controller 100 to start a processing sequence.

The processing method includes a holding step, a modified layer forming step, and a storing step. In the holding step, the controller 100 operates such that a suction force is applied from the vacuum suction source 86 through the on-off valve 85 to the suction pads 84 of the feed unit 80, and an annular frame F disposed within the cassette 70 and holding a workpiece W in which a modified layer K is to be formed is held under suction on the holder 82 of the feed nit 80. The controller 100 then operates such that the workpiece W held under suction on the holder 82 is removed from the cassette 70, and the workpiece W is inserted into the workpiece housing case 110. As shown in FIG. 8, the controller 100 operates such that the workpiece W is superposed on the holding surface 1a through the dicing tape T, the positive voltage is applied to the positive feeder terminal 62, and the negative voltage is applied to the negative feeder terminal 72, thus the workpiece W is attracted under suction to the holding surface 1a. Then, the controller 100 causes the frame clamps 116 to clamp the annular frame F, and controls the on-off valve 85 to stop applying the suction force from the vacuum suction source 86 to the suction pads 84. Then, the operation sequence goes to the modified layer forming step.

In the modified layer forming step, the controller 100 performs an alignment process on the laser beam irradiation unit 20 on the basis of an image of the workpiece W captured by the imaging means 50. Then, as shown in FIG. 9, the controller 100 controls the laser beam irradiation unit 20 to apply the laser beam L from the beam condenser 22 to the workpiece W. While applying the laser beam L to the workpiece W, the controller 100 controls the X-axis moving means 30, the Y-axis moving means 40, and the rotary drive source 60 to irradiate the workpiece W with the laser beam L along all the projected dicing lines S. At this time, the laser beam L is applied to the second surface 2b of the base 2 and transmitted through the electrostatic chuck table 1, forming a modified layer K within the workpiece W held on the holding surface 1a along all the projected dicing lines S. The electrostatic chuck table 1 is thus used to form the modified layer K within the workpiece W held on the holding surface 1a. The control sequence then goes to the storing step.

In the storing step, the controller 100 holds the annular frame F that is holding the workpiece W with the modified layer K formed therein along all the projected dicing lines S, under suction on the suction pads 84, releases the frame clamps 116 from the annular frame F, removes the workpiece W from the workpiece housing case 110, inserts the workpiece W into the cassette 70, and thereafter disables the suction pads 84 to release the annular frame F. The workpiece W with the modified layer K formed therein along all the projected dicing lines S will be divided into individual devices D in a next step.

In the electrostatic chuck table 1 according to the first embodiment, the base 2, the electrode assembly 3, the PET film 4 as a resin layer, and the UV adhesive 5 are all transmittable with respect to the laser beam L for processing the workpiece W. Consequently, the electrostatic chuck table 1 allows the laser beam L to be applied therethrough to the workpiece W while the reverse side WR of the workpiece that is free of metal layers and devices D is being held on the holding surface 1a. As a result, since it is not necessary for the electrostatic chuck table 1 to hold the face side WS of the workpiece W, the electrostatic chuck table 1 can hold the workpiece W without causing damage to the devices D that have surface irregularities. The workpiece W can thus be processed without the need for being specifically designed or removing the TEG pattern in advance. Therefore, the electrostatic chuck table 1 makes it possible to process the workpiece W with the laser beam L from the side of the holding surface 1a without damaging the devices D and removing the metal layers from the workpiece W, while the face side WS of the workpiece W on which the metal layers and the devices D are formed is being exposed and the reverse side WR thereof is being held on the holding surface 1a.

With the electrostatic chuck table 1, the laser processing apparatus 10, and the processing method according to the first embodiment, the positive attractive member 61 of the positive electrode 6 and the negative attractive member 71 of the negative electrode 7 of the electrode assembly 3 are semicircular in shape and formed on the first surface 2a, substantially in its entirety, of the base 2. The workpiece W is attracted to the holding surface 1a by forces generated between the positive and negative attractive members 61 and 71 which are formed on the first surface 2a, substantially in its entirety, of the base 2. As a result, since the electrostatic chuck table 1 produces attractive forces for the workpiece W on the holding surface 1a substantially in its entirety due to the forces generated between the positive and negative attractive members 61 and 71, the workpiece W can be attracted to and held by the first surface 2a, substantially in its entirety, of the base 2, instead of its outer edge drawn and held in position by a negative pressure.

The refractive index of indium tin oxide of which the electrode assembly 3 is made and the refractive index of the UV adhesive 5 that fills the inter-electrode area 3a are substantially equal to each other. Therefore, the electrostatic chuck table 1 allows the modified layer K to be formed at a desired position in the workpiece W.

Second Embodiment

Figure 10:
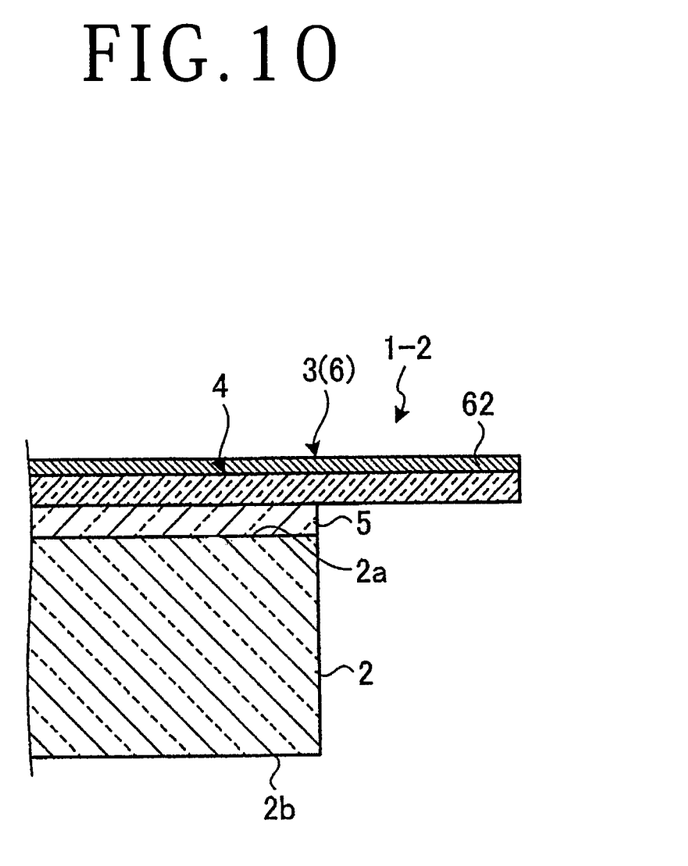
FIG. 10 is a fragmentary cross-sectional view of an electrostatic chuck table according to a second embodiment of the present invention.

An electrostatic chuck table according to a second embodiment of the present invention will be described below with reference to the drawings. FIG. 10 shows in fragmentary cross section the electrostatic chuck table according to the second embodiment. In FIG. 10, those parts which are identical to those according to the first embodiment are denoted by identical reference characters, and will not be described in detail below.

As shown in FIG. 10, the electrostatic chuck table, generally denoted by 1-2, according to the second embodiment includes a PET film 4 as a resin layer that is formed on a first surface 2a of a base 2 by a UV adhesive 5, and an electrode assembly 3 is formed on the PET film 4. An inter-electrode area 3a of the electrode assembly 3 and the gap between arcuate portions 61b and 71b of attractive members 61 and 71 and the outer edge of the PET film 4 are filled with the UV adhesive 5.

As is the case with the first embodiment, the base 2, the electrode assembly 3, the PET film 4 as a resin layer, and the UV adhesive 5 of the electrostatic chuck table 1-2 according to the second embodiment are all transmittable with respect to the laser beam L for processing the workpiece W. Consequently, the electrostatic chuck table 1-2 allows the laser beam L to be applied therethrough to the workpiece W while the reverse side WR of the workpiece W that is free of metal layers and devices D is being held on the holding surface 1a. As a result, the electrostatic chuck table 1-2 makes it possible to process the workpiece W with the laser beam L without damaging the devices D and removing the metal layers from the workpiece W.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing apparatus comprising:
   an electrostatic chuck table for holding a workpiece; and
   a laser beam irradiation unit for forming a modified layer within said workpiece held by said electrostatic chuck table with a laser beam having a wavelength allowing the laser beam to be transmitted through the workpiece;
   wherein said electrostatic chuck table includes:
   a plate-shaped base transmittable with respect to said laser beam having a predetermined wavelength allowing the laser beam to be transmitted through the base and the workpiece, said plate-shaped base having a first surface and a second surface opposite said first surface;
   an electrostatic attraction electrode assembly transmittable with respect to said laser beam having the predetermined wavelength, the electrostatic attraction electrode assembly being formed on the first surface of said base; and
   a resin layer transmittable with respect to said laser beam having the predetermined wavelength, the resin layer covering said electrode assembly and providing a holding surface for holding said workpiece thereon;
   wherein said workpiece has a reverse side held on the holding surface of said electrostatic chuck table, and said laser beam is applied from said laser beam irradiation unit to said workpiece from a side of the second surface of said base to form a modified layer within said workpiece.

2. The laser processing apparatus according to claim 1, further comprising a housing case including said base.

3. The laser processing apparatus according to claim 2, wherein said housing case includes a pair of frame clamps configured to secure the workpiece to the electrostatic chuck table.

4. The laser processing apparatus according to claim 1, wherein said electrostatic attraction electrode assembly includes a positive electrode and a negative electrode.

5. The laser processing apparatus according to claim 4, wherein said electrostatic attraction electrode assembly includes an inter-electrode area between said positive electrode and said negative electrode, said inter-electrode area insulating said positive and negative electrodes from each other.

6. A laser processing apparatus comprising:
an electrostatic chuck table for holding a workpiece; and
a laser beam irradiation unit for forming a modified layer within said workpiece held by said electrostatic chuck table with a laser beam having a wavelength allowing the laser beam to be transmitted through the workpiece;
wherein said electrostatic chuck table includes:
a base transmittable with respect to said laser beam having a predetermined wavelength allowing the laser beam to be transmitted through the base and the workpiece, said base having a first surface and a second surface opposite said first surface;
an electrostatic attraction electrode assembly transmittable with respect to said laser beam having the predetermined wavelength, the electrostatic attraction electrode assembly being formed on the first surface of said base; and
a holding surface on said electrostatic chuck table configured for holding said workpiece thereon,
wherein said workpiece has a reverse side held on the holding surface of said electrostatic chuck table, and said laser beam is applied from said laser beam irradiation unit to said workpiece from the second surface of said base to form a modified layer within said workpiece.

* * * * *